United States Patent [19]
Mailloux et al.

[11] Patent Number: 5,485,158
[45] Date of Patent: Jan. 16, 1996

[54] LINEAR NEAR FIELD TEST FACILITY AND PROCESS

[75] Inventors: Robert J. Mailloux, Wayland; Peter R. Franchi, Winchester; Harvey E. Tobin, Dracut, all of Mass.

[73] Assignee: The United States of America as represented by the Secretary of the Air Force, Washington, D.C.

[21] Appl. No.: 278,341

[22] Filed: Jul. 21, 1994

[51] Int. Cl.$^6$ .................................................... G01S 7/40
[52] U.S. Cl. .................................................... 342/165
[58] Field of Search ............................ 342/4, 360, 165, 342/173

[56] References Cited

U.S. PATENT DOCUMENTS

| | | | |
|---|---|---|---|
| 3,158,861 | 11/1964 | Iribe | 342/165 |
| 4,453,164 | 6/1984 | Patton | 342/360 |
| 4,553,145 | 11/1985 | Evans | 342/360 |
| 4,661,820 | 4/1987 | Pouit et al. | 342/351 |
| 4,740,790 | 4/1988 | Hess, Jr. et al. | 342/361 |
| 4,800,387 | 1/1989 | Joy | 342/165 |

*Primary Examiner*—Charles T. Jordan
*Assistant Examiner*—Christopher Keith Montgomery
*Attorney, Agent, or Firm*—William G. Auton; Jacob N. Erlich

[57] ABSTRACT

A method to measure the far field antenna pattern of an experimental antenna on a smaller range than conventionally used. The basic innovation of the present invention is that the implementation is moved in straight line, toward or away from the antenna under test (AUT), and the measurements are taken while the AUT is rotated about its phase center in a manner that is synchronized with the radial probe.

2 Claims, 1 Drawing Sheet

CARRIAGE FOR PROBE ANTENNA, 170

PROBE ANTENNA 150

TRACKS, 160

$R_0$ $R_0 \cos^2(\theta)$ $\theta$

ROTATED ARRAY, 101

ARRAY UNDER TEST (AUT), 100

TEST PROBE 200

ANTENNA UNDER TEST, 250

LINEAR NEAR FIELD TEST FACILITY AND PROCESS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to radar antennas, and more specifically the invention pertains to a system and a process for measuring the antenna pattern of a phased array antenna.

Traditional antenna measurements use $2D^2/\lambda$ as a criteria for measuring an antenna under test (AUT) in the far field, where R is the distance from the AUT to a point in space, D is the aperture size of the AUT, and $\lambda$ is the operating wavelength. Problems arise when D becomes large, which increases the distance R, therefore more real estate is needed to measure the far field antenna pattern.

The requirements of the modern radars have led to the development of phased-array antennas that continue to grow in size, with current antenna lengths of at least 30 wavelengths. This can present a major problem in taking antenna pattern measurements, because of the requirement to measure these patterns in the antenna's far field. Consider a C-band antenna that measures 10 feet by 100 feet. Using the standard far field criteria of $2D^2/\lambda$ where D is the aperture size, and $\lambda$ is the operating wavelength, the far field measurements would have to be taken at a distance of 23 miles from the antenna.

Fortunately, techniques have been developed to measure the far field pattern of the antenna under test on smaller indoor ranges. Advantages of using these ranges include: reduction of outside interference, reduction of testing time lost to poor weather conditions, the ability to do classified testing, and the reduction of electromagnetic transmissions into the environment. This last point is especially important with the current interest in environmental impact analysis. Unfortunately, there are still problems with these techniques. For example, the transformation of data collected by near field probing into the far field requires many sample points. Another problem is that a large reflector with a high surface tolerance restricts the use of a compact range.

Development over the years has led to techniques to measure the far field pattern of the AUT on smaller ranges. Using a small range reduces outside interference, eliminates testing time due to poor weather conditions, and provides the option of doing classified testing. Many of the previous smaller range techniques eliminate or lessen these problems. There are however, other problems with these techniques. For example, transformation from near field probing to the far field requires many sample points, the large size and high surface tolerance requirements of a reflector restricts the use of a compact range.

The task of reducing the range requirements while measuring the far field antenna patterns of large antenna arrays is alleviated, to some extent, by the systems disclosed in the following U.S. Pat. Nos., the disclosures of which are incorporated herein by reference:

U.S. Pat. No. 5,204,685 issued to Franchi et al;
U.S. Pat. No. 5,001,494 issued to Dorman et al;
U.S. Pat. No. 4,998,112 issued to Franchi et al;
U.S. Pat. No. 4,811,023 issued to Gelernter et al;
U.S. Pat. No. 4,704,614 issued to Poirer et al; and
U.S. patent application Ser. No. 08/112,813 for Simmers et al The patents of Franchi et al disclose a method for measuring the far field antenna on a range by applying a correction factor. The Poirer et al. patent discloses measuring the near-field radiation by attaching a field sensing probe to a pendulum bob and mounting the antenna under a Foucalt pendulum. The entire antenna aperture can be scanned without moving the antenna. The motion of the probe covers part of an external sphere centered at the pivot point of the pendulum and having a radius equal to the length of the pendulum. Appropriate transformation of the measured near-field data gives the far-field radiation pattern. The remaining patents are of similar interest.

While the above-cited references are instructive, the need remains to measure the far field patterns of phased array antennas in a manner that reduces the range requirements. The present invention is intended to satisfy that need.

SUMMARY OF THE INVENTION

This invention is a method to measure the far field pattern of an experimental antenna on a smaller range than conventionally used. The basic innovation of the present invention is that the implementation is moved in straight line, toward or away from the antenna under test (AUT), and the measurements are taken while the AUT is rotated about its phase center in a manner that is synchronized with the radial probe.

The present invention includes a process for measuring a phased array's far field antenna pattern which is exhibited by a beam emitted by the antenna. In one embodiment of the invention this process is accomplished in four steps and can greatly reduce the range requirements at which a probe antenna must be placed in order to measure far field phenomena.

When a radar beam is emitted by an antenna, its exhibits different phenomena at near field and far field locations. At far field locations, the main beam of the antenna pattern is clearly distinguishable from sidelobe phenomena. At near field locations, the antenna pattern is merely a blob of electromagnetic energy in which the main beam is not so easily distinguished from the sidelobes. In order to measure far field antenna patterns, a probe antenna must be placed perhaps several kilometers from the antenna face. This is inconvenient for testing an antenna under laboratory conditions.

In the present invention, the first step of the process includes focusing the beam onto a probe antenna which measures the beam, the probe antenna being positioned at a distance R.

The second step of the process entails measuring the beam with the probe antenna.

The third step of the process entails moving the probe antenna to different positions that are on a linear path near the phased array antenna.

The fourth step of the process entails repeating the focusing, measuring and moving steps.

In the present invention, the moving step is accomplished by repositioning the probe antenna along different positions of ro along a line given by $[ro/Ro]\cos^4\theta$ where $\theta$ is an angle from broadside to the probe antenna, and Ro is the focal arc of the phased array antenna. As discussed below, the probe is positioned along the linear path.

It is an object of the present invention to allow the testing of antenna pattern far field phenomena at up to nearly 1/10 of the distances normally used.

It is another object of the present invention to minimize phase aberrations due to a defocusing error.

These together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a system and a process for measuring the far field antenna pattern of a phased array antenna 100. The phased array is focused at a probe antenna 150 which is a specific distance away from the aperture. The antenna pattern is then measured by moving the probe antenna on a predetermined path.

Figure 1:
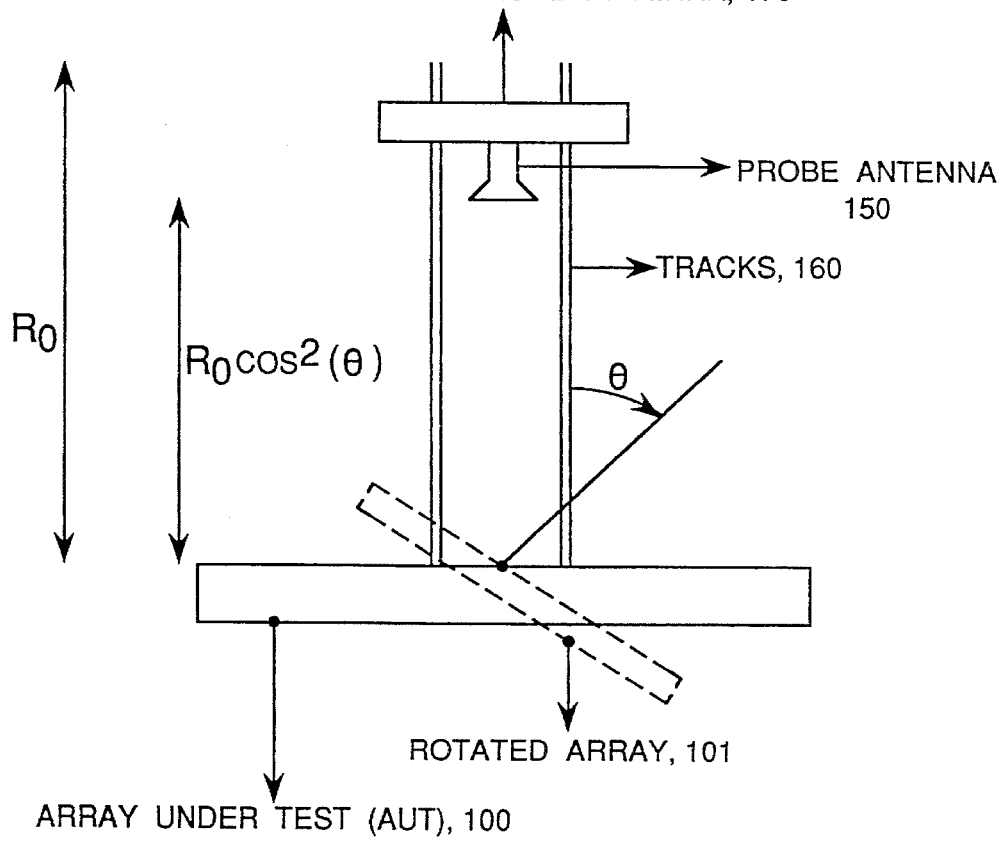
FIG. 1 is an illustration of the antenna testing geometry used in the present invention.

In the present invention, illustrated in FIG. 1, the antenna under test (AUT) is a rotated array, 100 which is focused at the distance $R_O$ and the array positioned as shown (solid) in the figure. The array is rotated by some angle θ about its center of phase as shown (dashed) in the figure. The probe moves along a straight line track, either toward or away from the AUT according to the previous expression for $r_o$. The array pattern is then measured for all far field angles out to the angular limit of ±50° by rotation of the AUT, simultaneously moving the probe according to the distance $r_o$, and correcting the amplitude of the received signal to account for the change in measurement distance. In addition, the probe can be rotated to account for variation in r if this is necessary due to the size of the antenna.

In addition, the amplitude of the received signal has to be modified in synchronism with the probe motion, to account for the change in measurement distance. Since the AUT is rotated in this method, some care needs to be taken to assure that the array main beam is not scattered back toward the probe antenna by chamber wall reflections. As the probe is moved along the straight line track and the AUT is rotating, the distance between the probe antenna and the center of the AUT changes. To correct for amplitude variations resulting from changes in distance between the AUT and probe antenna, this amplitude controller could be an attenuator which functions according to the expression, $$\left[ \frac{r_0}{R_0} \right]^2 = \cos^4(\theta) \tag{1}$$

so that the attenuator setting varies from zero dB at broadside, to a large number as the angle is increased.

In the preferred embodiment, the antenna under test 100 will be rotated at angle θ, and focus its output at a near field point Ro to reduce the far field distance. The test probe 150 is placed on the carriage 170 and track at position ro given by equation 1. The test probe is also matched to compensate for amplitude variation. This technique will permit very practical near field antenna ranges to measure large aperture antennas in an environment.

Figure 2:
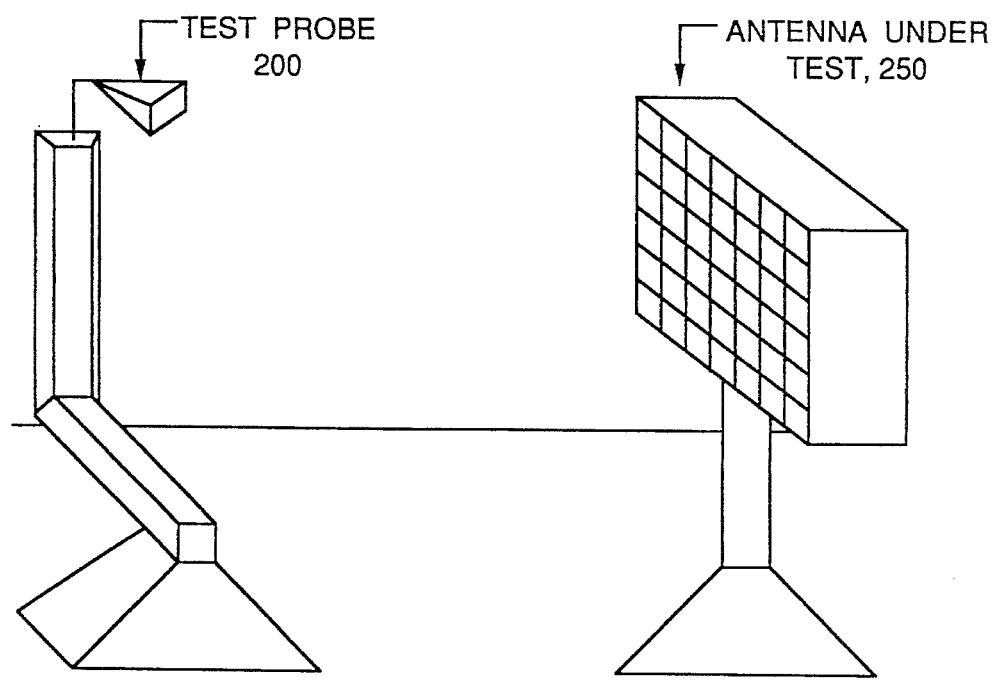
FIG. 2 is an illustration of the prior art elements of an arc range test facility.

FIG. 2 is an illustration of the prior art arc range test elements used in U.S. Pat. No. 5,204,685 as well as by the process of the present invention. In FIG. 2, the emissions of the antenna under test are focussed on the probe antenna, which measures them. Subsequent measurements are made as the probe antenna is moved to different positions on an elliptical arc about the antenna under test. The present invention is a test facility that differs from FIG. 2 in that the antenna under test is rotated and test probe is moved linearly for successive measurements.

The advantage of the present invention over the system of FIG. 2 is that the complex curved motion of the probe antenna required in the two attachments is replaced by a (straight line) motion of the probe and a simple rotation of the antenna under test. Both of these motions are accomplished on conventional equipment: a straight track and a rotating conventional mount. The use of these two simple pieces of equipment that are both under computer control avoids the need to move the probe on a complex curved track. This straight line motion produces the $R_o\cos^2(\theta)$ curve exactly, which then makes the quadric term in the expansion equal to zero. Therefore, there is no residual error, and the cubic term becomes the dominant error source.

In the system of FIG. 1, the carriage 170 and the tacks 160 serve as a means of moving and fixing the probe antenna 150 at adjustable linear distance of ro from the AUT, 100 where ro is calculated using the relationship of equation 1.

Commercially-available carriage and track assemblies may be used, and these elements need not be discussed in detail.

The present invention might therefore be viewed as a five step process which provides two improvements over the process in the above-cited Franchi et al. patents. These two improvements include the placement of the test probe in different points along a line with a predetermined distance under test, as successive measurements of the antenna's radiation pattern are made. The first step of this process is the rotating of the antenna to an angle θ as shown in FIG. 1, chamber to reduce the reflections from the walls as measurements are made.

The second step entails focusing the beam of the antenna under test to a point Ro near the probe antenna, while the third step would be measuring the electromagnetic power of the beam.

The fourth step entails moving the probe antenna to different positions on an line (with distances given by equation 1) about the antenna under test, and the fifth step entails repeating the focusing, measuring and moving steps.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A process for measuring a phased array antenna's far field antenna pattern which is exhibited as electro-magnetic power measured in watts per square centimeter by a beam emitted by the phased array antenna wherein said phased array antenna has an antenna center, said process comprising the steps of:

rotating the phased array antenna by an angle θ which is measured from foresight;

focusing the beam at a point Ro near a probe antenna which measures the beam;

measuring the electromagnetic power of the beam with the probe antenna to identify a pattern of electromagnetic power emitted therefrom;

moving the probe antenna to different positions that are on a linear path from the phased-array antenna; wherein said moving step is accomplished by repositioning the probe antenna along different positions ro on a line given by $$\left[\frac{r_0}{R_0}\right]^2 = \cos^4(\theta)$$

and repeating the rotating, focusing, measuring and moving steps.

2. A test facility for measuring a phased array antenna's far field antenna pattern which is exhibited as electromagnetic power measured in watts per square centimeter by a beam emitted by the phased array antenna focussed at a position Ro wherein said phased array antenna has an antenna center, said test facility comprising:

a means for rotating said phased array antenna at different angles θ from foresight;

a probe antenna which is positioned to different positions as successive measurements of the beam of the phased array antenna are made; and a means for setting said probe antenna to different predetermined distances ro from said antenna center wherein said probe antenna is repositioned by said setting means along different positions on a line wherein said different predetermined distances ro are given by:

$$\left[\frac{r_0}{R_0}\right]^2 = \cos^4(\theta).$$

* * * * *